US009606160B2

(12) United States Patent
Ochs et al.

(10) Patent No.: US 9,606,160 B2
(45) Date of Patent: Mar. 28, 2017

(54) DETECTION OF STUCK IN RANGE SENSOR AND METHOD

(71) Applicant: GM GLOBAL TECHNOLOGY OPERATIONS LLC, Detroit, MI (US)

(72) Inventors: David S. Ochs, Torrance, CA (US); Brian A. Welchko, Torrance, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 339 days.

(21) Appl. No.: 14/197,960

(22) Filed: Mar. 5, 2014

(65) Prior Publication Data

US 2015/0253368 A1    Sep. 10, 2015

(51) Int. Cl.
G01R 31/00 (2006.01)
G01R 31/28 (2006.01)
G01R 35/00 (2006.01)
G01D 5/244 (2006.01)

(52) U.S. Cl.
CPC ........... *G01R 31/006* (2013.01); *G01R 35/00* (2013.01); *G01D 5/24461* (2013.01); *G01R 31/2829* (2013.01)

(58) Field of Classification Search
CPC ........................................................ B60L 3/04
See application file for complete search history.

(56) References Cited

U.S. PATENT DOCUMENTS

| | | | | |
|---|---|---|---|---|
| 6,016,465 A * | 1/2000 | Kelly | ....................... | G05B 9/02 376/215 |
| 6,192,310 B1 * | 2/2001 | Marcheguet | ........ | F02D 41/1441 60/276 |
| 7,739,897 B2 * | 6/2010 | Wang | .................. | G01F 25/0061 73/1.73 |
| 7,878,057 B2 * | 2/2011 | Wang | .................. | G01F 25/0061 73/290 R |
| 2008/0245130 A1 * | 10/2008 | Wang | .................. | G01F 25/0061 73/1.73 |
| 2012/0260625 A1 * | 10/2012 | Feldmann | ............. | F01N 3/2066 60/273 |
| 2014/0046534 A1 * | 2/2014 | Lazar, II | ................... | B60L 3/04 701/33.9 |
| 2015/0013646 A1 * | 1/2015 | Qi | ......................... | G01F 23/263 123/478 |
| 2015/0167560 A1 * | 6/2015 | Wu | ....................... | F02D 41/221 701/102 |
| 2015/0260589 A1 * | 9/2015 | Ochs | ..................... | G01K 19/00 374/1 |

* cited by examiner

*Primary Examiner* — Jermele M Hollington
(74) *Attorney, Agent, or Firm* — Quinn Law Group, PLLC

(57) ABSTRACT

A method for detecting a sensor that is stuck in range includes computing a variation value for each of a first signal and a second signal generated by a respective first and second sensor, wherein the first and second signals are correlated signals. The variation value for each of the first and second signals is computed for the same diagnostic period, such that when one of the first and second sensors is generating a signal which is stuck in range during the diagnostic period, the signal stuck in range will be characterized by a variation value which is much less than the variation value of the correlated signal. The magnitude of difference between the variation values of the first and second signals can be compared to a predetermined fault threshold to diagnose a sensor stuck in range.

11 Claims, 2 Drawing Sheets

DETECTION OF STUCK IN RANGE SENSOR AND METHOD

TECHNICAL FIELD

This disclosure relates to detection of a stuck in range sensor.

BACKGROUND

Stuck in range is one known failure mode of sensors in a vehicle. Others include out of range high, out of range low, and offset. A sensor that is stuck in range has failed in such a way as to produce a constant signal that is within the normal reading range. A conventional rationality diagnostic can be used to compare the values of a first signal from a first sensor to a second signal from a second sensor, where the first and second signals are correlated signals, to determine if one of the first and second sensors is stuck in range, by comparing the absolute difference between the signals to a fault limit. If the absolute difference is too large, at least one of the signals is considered to be stuck in range and faulted. In practice, the fault limit for this type of rationality diagnostic is set quite large to minimize false indications of fault by the diagnostic. As such, this type of rationality diagnostic is limited to diagnosing sensors that have a significant amount of offset or those that are stuck in range at a value far from nominal, such that this type of rationality diagnostic has a detection range which is similar to and limited in sensitivity to that of an out of range diagnostic.

SUMMARY

A conventional rationality diagnostic which compares the values from correlated first and second sensors to determine if one of the sensors is stuck in range is limited in sensitivity to prevent false indications of a stuck sensor, and may lack sensitivity to detect a sensor which is stuck in range. A method for detecting a sensor that is stuck in range includes computing a variation value for each of a first signal and a second signal generated by a respective first and second sensor, wherein the first and second signals are normally correlated signals. In the event one of the first and second sensors is generating a signal which is stuck in range, the signal generated by a stuck in range sensor will be characterized by a variation value which is close to zero and/or much less than that of the variation value of the correlated signal generated by the other non-stuck sensor. By comparing the variation values of the correlated signals, this variation value diagnostic can be used to detect a sensor which is stuck in range with substantially greater sensitivity than a conventional rationality diagnostic. Further, by comparing the variation values of the correlated first and second signals, a stuck in range sensor can be distinguished from a sensor sensing a steady state condition. The variation value diagnostic for detecting a stuck sensor described herein can be combined and/or applied in parallel with a conventional rationality diagnostic to diagnose sensors.

A method of diagnosing a stuck in range sensor includes receiving a monitored signal from a monitored sensor, and receiving a correlated signal from a correlated sensor, where the correlated signal is correlated to the monitored signal. A variation value of the monitored signal is determined based on a first monitored signal deviation and at least a second monitored signal deviation, and a variation value of the correlated signal is determined based on a first correlated signal deviation and at least a second correlated signal deviation. A state of the monitored sensor is then determined based on a magnitude of a difference between the variation value of the monitored signal value and the variation value of the correlated signal value, which is determined over a diagnostic period which is the same diagnostic period for determining the variation value of the monitored signal and determining the variation value of the correlated signal. The magnitude of the difference between the monitored and correlated variation values is compared to a fault threshold, such that a stuck in range state of the monitored sensor is determined when the magnitude of the difference is greater than or equal to a fault threshold.

The first monitored signal deviation is based on a magnitude of a difference between a first monitored signal value sampled at a first monitored sample time and a second monitored signal value sampled at a second monitored sample time, and the second monitored signal deviation is based on a magnitude of a difference between the second monitored signal value and a third monitored signal value sampled at a third monitored sample time. The first, second and third monitored sample times are different and sequential times. The first correlated signal deviation is based on a magnitude of a difference between a first correlated signal value sampled at the first correlated sample time and a second correlated signal value sampled at the second correlated sample time; and the second correlated signal deviation is based on a magnitude of a difference between the second correlated signal value and a third correlated signal value sampled at the third correlated sample time. The first, second and third correlated sample times are different and sequential times. Further, the first monitored sample time and the first correlated sample time are synchronized with each other, the second monitored sample time and the second correlated sample time are synchronized with each other, and the third monitored sample time and the third correlated sample time are synchronized with each other. In one example, the first monitored sample time and the first correlated sample time occur simultaneously at a first concurrent sample time, the second monitored sample time and the second correlated sample time occur simultaneously at a second concurrent sample time, and the third monitored sample time and the third correlated sample time occur simultaneously at a third simultaneously sample time.

A system for diagnosing a stuck in range sensor includes a control module in operable communication with a variation determination module, a sensor diagnostic module, a monitored sensor, and a correlated sensor. The control module receives a monitored signal from the monitored sensor and a correlated signal from the correlated sensor, where the correlated signal and the monitored signal are correlated to each other. The system further includes a monitored signal variation value generated by the variation determination module based on the monitored signal, and a correlated signal variation value generated by the variation determination module based on the correlated signal. The state of the monitored sensor is determined by the sensor diagnostic module based on the variation value of the monitored signal and the variation value of the correlated signal value, such that a stuck in range indicator is generated by the sensor diagnostic module when a magnitude of a difference between the variation value of the monitored signal value and the variation value of the correlated signal value is greater than or equal to a fault threshold corresponding to a stuck in range state of the monitored sensor.

In one example, the system includes a power inverter module operatively connected to a battery, a monitored sensor sensing one of an inverter input voltage of the power inverter module and a battery voltage of the battery, where the inverter input voltage and the battery voltage are correlated to each other, and a correlated sensor sensing the other of the inverter input voltage and the battery voltage. By way of example, the power inverter module and battery may be operatively connected to a motor-generator of a powertrain, which in one example is a powertrain of a hybrid electric vehicle.

The above features and advantages and other features and advantages of the present invention are readily apparent from the following detailed description of the best modes for carrying out the invention when taken in connection with the accompanying drawings.

DETAILED DESCRIPTION

Figure 1:
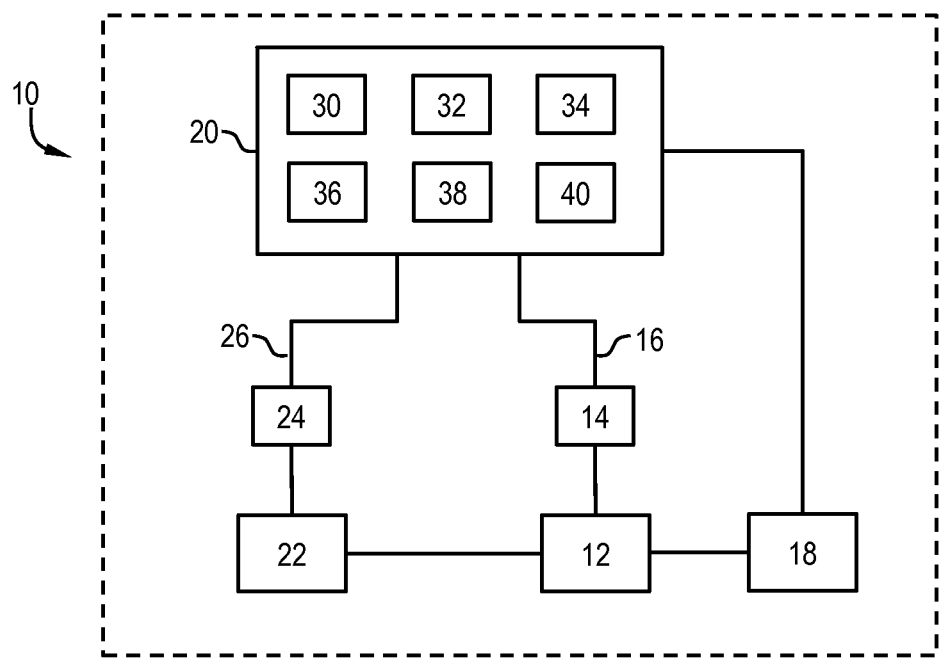
FIG. 1 is a schematic diagram showing an exemplary system for detecting a sensor that is stuck in range.
Figure 2:
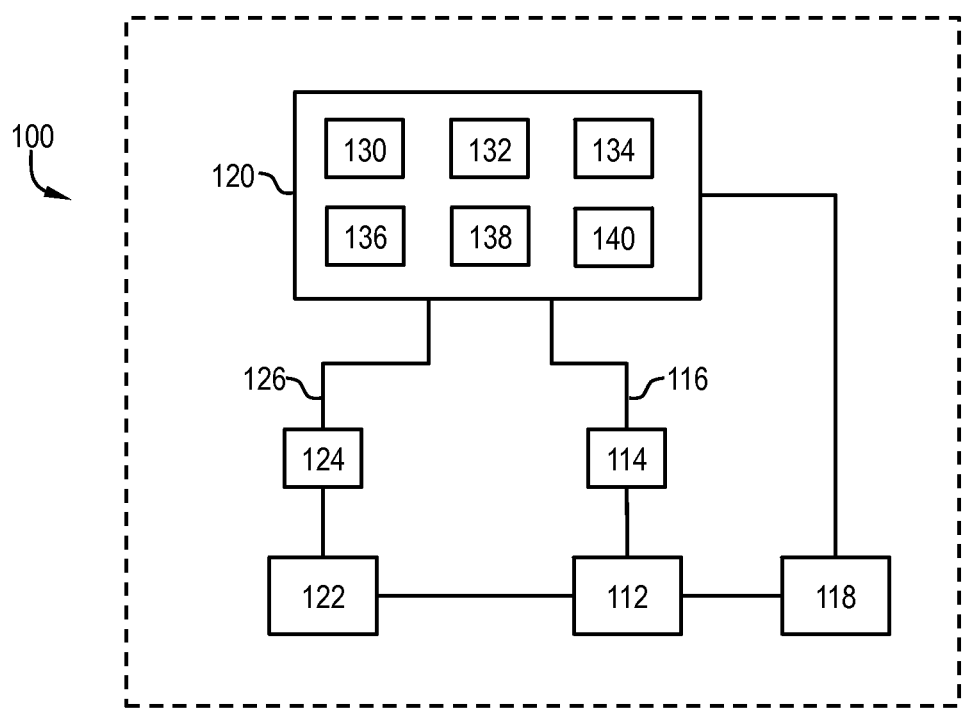
FIG. 2 is a schematic diagram of the exemplary system of FIG. 1, including a vehicle sensor.
Figure 3:
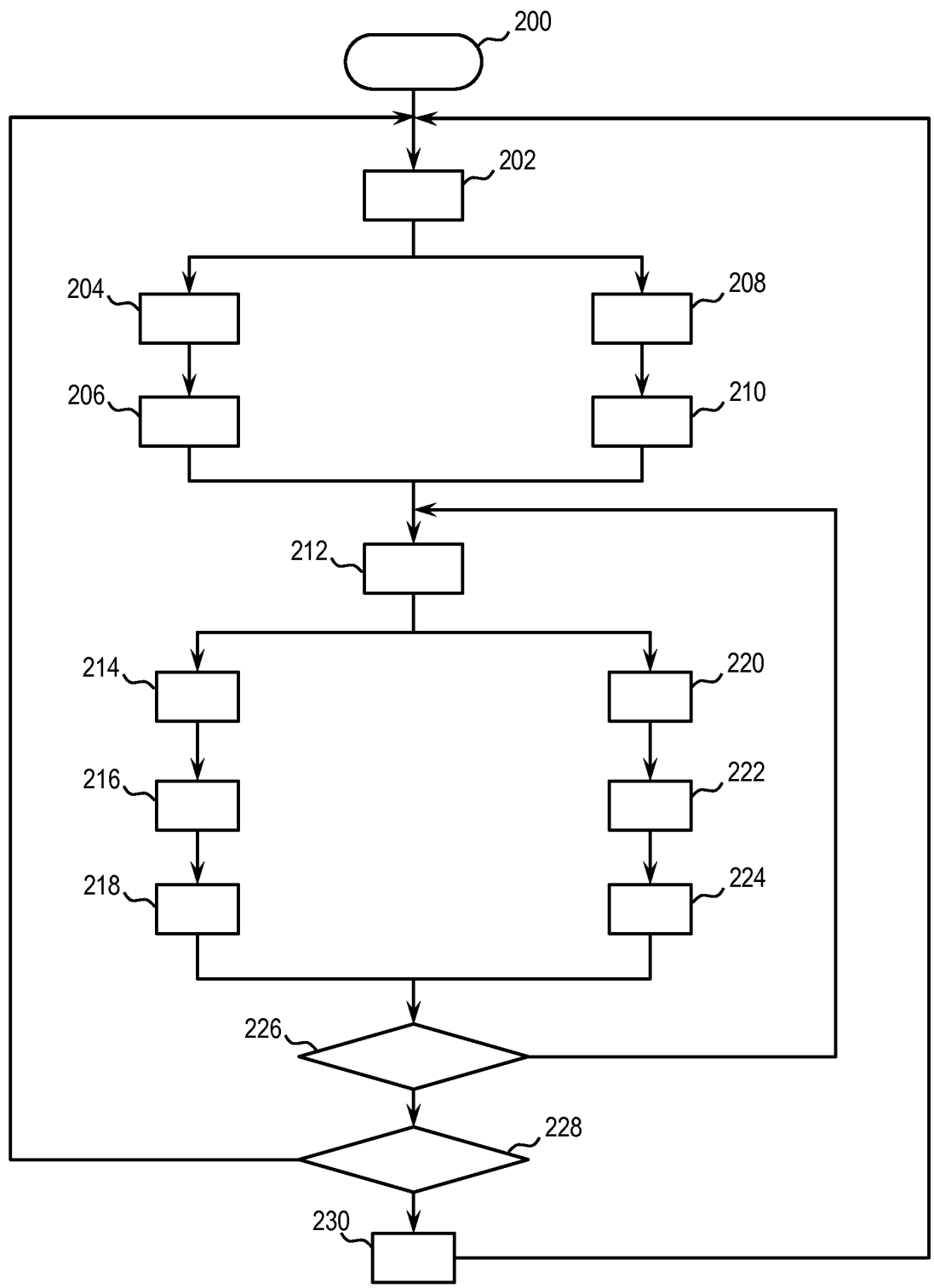
FIG. 3 is a schematic flow chart diagram of an algorithm or method for detecting a sensor that is stuck in range using the system of FIG. 1.

Referring to the figures, like numerals indicate like parts throughout the several views. The elements shown in FIGS. 1-3 are not necessarily to scale or proportion. Accordingly, the particular dimensions and applications provided in the drawings presented herein are not to be considered limiting. The following description is merely exemplary in nature and is in no way intended to limit the disclosure, its application, or uses. As used herein, the phrase at least one of A, B, and C should be construed to mean a logical (A or B or C), using a non-exclusive logical or. It should be understood that steps within a method may be executed in different order without altering the principles of the present disclosure. As used herein, the term "module" refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

A sensor which is stuck in range may generate a signal having a constant value or a signal having minimal change in value such that the change in the sensor signal is contained within a very limited range. By way of non-limiting example, a sensor may be stuck in range as a result of a malfunctioning sensor, a faulty connection from the sensor to the control module or to the element being sensed by the sensor, or another electrical malfunction. A sensor which is stuck in range may affect control of the element being sensed by the sensor, and/or may affect control of the system being controlled based on the sensor signal.

FIG. 1 is a schematic diagram showing an exemplary system, generally indicated at 10, including an exemplary control module 20 for detecting a stuck in range state of a sensor. FIG. 2 is a schematic diagram showing a powertrain generally indicated at 100 and including a control module 120 configured similar to the control module 20 of FIG. 1 for detecting a sensor that is stuck in range, where the sensor is one of a plurality of powertrain sensors. The powertrain system 100 may be a powertrain of a vehicle (not shown), which in one example may be a hybrid vehicle. FIG. 3 shows a high-level diagram of a method to diagnose a sensor as being in a stuck in range state, which begins with a start or initialization step indicated at 200 in FIG. 3.

Referring to FIG. 1, shown is a system generally indicated at 10 and including a control module 20, a first sensor 14, and a second sensor 24. The first and second sensors 14, 24 are in operative communication with the control module 20. The system 10 further includes a first member 12 and a second member 22. The first sensor 14 is configured to sense a condition of the first member 12 and to output a first sensor signal 16 to the control module 20, such that the first sensor signal 16 is defined by the sensed condition of the first member 12. The second sensor 24 is configured to sense a condition of the second member 22 and to output a second sensor signal 26 to the control module 20, such that the second sensor signal 26 is defined by the sensed condition of the second member 22. The system 10 and/or the first and second members 12, 22 are arranged such that the first sensor signal 16 and the second sensor signal 26 are correlated to each other, and such that there exists a known relationship between the first sensor signal 16 and the second sensor signal 26 for the system 10. By way of non-limiting example, the correlation or known relationship between the first and second sensor signals 16, 26 may be defined by one or more of an operating relationship between the first and second members 12, 22, an operating relationship between a third member 18 and one or both of the first and second members 12, 22, an operating environment shared by the first and second members 12, 22, a condition resultant from a shared command received by the first and second members 12, 22, for example, from a condition resultant from a shared command output by the control module 20 or other shared input (not shown), etc. Further, when the first and second sensors 14, 24 are functioning under normal conditions, a correlation exists between the first and second signals 16, 26. As such, when one of the first and second sensors 14, 24 is non-functional or functioning abnormally, as is the case when the one of the first and second sensors 14, 24 is in a stuck in range state, the signal of the stuck sensor will deviate from the correlated relationship between the monitored and correlated sensor signals 16, 26. By monitoring the relationship between a variation value defined by each of the sensors 14, 24 using the system and method described herein, a stuck one of the first and second sensors 14, 24 can be detected, and a stuck sensor indicator can be outputted by the control module 20 to indicate detection of a stuck sensor.

It would be understood that because the first and second sensor signals 16, 26 are correlated, in the event one of the first and second sensors 14, 24 becomes stuck, the loss of correlation at the time the one of the first and second sensors 14, 24 becomes stuck can be analyzed to determine which of the first and second sensors 14, 24 is stuck. For purposes of illustrating the system and method provided herein for detection of a stuck in range sensor, in an exemplary description the first sensor 14 will be referred to herein as a monitored sensor 14 which is outputting a monitored sensor signal 16 based on sensing a condition of a monitored member 12, and the second sensor 24 will be referred to herein as a correlated sensor 24 which is outputting a correlated sensor signal 26 based on sensing a condition of a correlated member 22, and the exemplary system and method will be described to detect a stuck in range condition of the monitored sensor 14 using the monitored signal 16 and the correlated signal 26. The monitored sensor signal 16 may also be referred to herein as the monitored signal 16. The correlated sensor signal 26 may also be referred to herein as the correlated signal 26.

The monitored sensor 14 may be diagnosed as stuck in range based on an analysis of a series of samples of the monitored signal 16 and the correlated signal 26 taken at different sample times, where the samples of monitored signal 16 and the correlated signal 26 taken at each of the different sample times are synchronized as described in further detail herein. A variation value determined for the monitored sensor 14 may be compared with a variation value determined for the correlated sensor 24 within the same diagnostic period to determine whether the monitored sensor 14 is stuck in range. In one example, a magnitude of the difference in the monitored sensor variation value and the correlated sensor variation value is compared to a fault threshold corresponding to a stuck in range sensor, to determine whether the monitored sensor 14 is stuck in range.

A first monitored signal deviation may be determined for the monitored sensor 14 based on a magnitude of a difference between a sample of the monitored sensor signal at a first monitored sample time and a sample of the monitored sensor signal 16 at a second monitored sample time, where the first monitored sample time and the second monitored sample time are different times. A second signal deviation may be determined for the monitored sensor 14 based on a magnitude of a difference between a sample of the monitored sensor signal at a third monitored sample time and the sample of the monitored sensor signal 16 previously taken at the second monitored sample time, where the third monitored sample time is different from the first and second monitored sample times. A plurality of monitored sensor signal deviations including the first and second monitored signal deviations may be determined during a predetermined diagnostic period, and a monitored sensor variation value may be determined based on the plurality of monitored sensor signal deviations. In one example, the monitored sensor variation value may be a sum of the plurality of monitored sensor signal deviations. In another example, the monitored variation value may be an average of the plurality of monitored sensor signal deviations. The predetermined diagnostic period may be defined, for example, by a diagnosis time monitored by the timer module 40, and/or by performing a predetermined number of samples of the monitored and correlated signals 16, 26.

Similarly, a first signal deviation may be determined for the correlated sensor 24 based on a magnitude of a difference between a sample of the correlated sensor signal 26 at a first correlated sample time and a sample of the correlated sensor signal 26 at a second correlated sample time, where the first correlated sample time and the second correlated sample time are different times, and such that the first monitored sample time and the first correlated sample time are synchronized to each other, and the second monitored sample time and the second correlated sample time are synchronized to each other. A second signal deviation may be determined for the correlated sensor 24 based on a magnitude of a difference between a sample of the correlated sensor signal taken at a third correlated sample time and the sample of the correlated sensor signal 26 previously taken at the second correlated sample time, where the third monitored sample time is different from the first and second monitored sample times, and the third monitored sample time and the third correlated sample time are synchronized to each other.

In one example, the first monitored sample time and the first correlated sample time are synchronized to occur simultaneously such that the first monitored sample time and the first correlated sample time are the same first time, the second monitored sample time and the second correlated sample time are synchronized to occur simultaneously such that the second monitored sample time and the second correlated sample time are the same second time, and the third monitored sample time and the third correlated sample time are synchronized to occur simultaneously such that the third monitored sample time and the third correlated sample time are the same third time, and such that the first, second, and third sample times are different times.

In another example, the first monitored sample time and the first correlated sample time may be synchronized such that the first monitored sample time and the first correlated sample time are non-concurrent; the second monitored sample time and the second correlated sample time are non-concurrent, and the third monitored sample time and the third correlated sample time are non-concurrent. For example, the monitored sensor 14 may output the monitored signal 16 at a first frequency, and the correlated sensor 24 may output the correlated signal 26 at a second frequency, such that the outputted monitored signal 16 and the outputted correlated signal 26 are non-concurrent to each other. In this event, for example, the sampling may be synchronized such that first monitored sample time of the monitored signal 16 corresponds to an output of the monitored signal 16 at the monitored signal frequency, and the first correlated sample time captures the next output of the correlated signal 26 following the first monitored sample time, which occurs based on the correlated signal frequency. In this manner, the first monitored sample time and the first correlated sample time are synchronized by being the nearest adjacent in time signals output from the respective monitored and correlated sensors 14, 24, to represent substantially the same operating conditions while being non-concurrent due to differing output frequencies. The same approach can be applied to synchronizing the second monitored sample time and the second correlated sample time, to synchronizing the third monitored sample time and the third correlated sample time, and so on.

The examples provided herein are non-limiting, and other synchronizing means may be used. For example, the timing of the first monitored sample time and the first correlated sample time may be synchronized based on a delay between those events, operations, inputs, conditions, outputs etc. of the monitored and correlated members 12, 22 which are correlated events, operations, inputs, conditions, outputs, etc.

A plurality of correlated sensor signal deviations, including, for example, the first and second correlated signal deviations, may be determined during a predetermined period such as a diagnostic period, and a correlated sensor variation value may be determined based on the plurality of correlated sensor signal deviations. In one example, the correlated sensor variation value may be a sum of the plurality of correlated sensor signal deviations determined over the diagnostic period. In another example, the correlated variation value may be an average of the plurality of the correlated sensor signal deviations determined over the diagnostic period.

The state of the monitored sensor 14 may be determined based on a comparison of the monitored sensor variation value and the correlated sensor variation value, where the monitored and correlated sensor variation values are determined over the same diagnostic period. With the monitored sensor 14 in a stuck in range state, the variation value of the monitored sensor 14 will be close to zero, however the variation value of the correlated sensor 24 would be expected to be greater than the variation value of the stuck in range sensor 14, and greater than zero. The magnitude of the difference between the monitored sensor variation value and the correlated sensor variation value can be compared to a threshold value, which may be a calibrated value, such that when the monitored sensor 14 is stuck in range, the magnitude of the difference between the monitored and correlated sensor variation values will be equal to or greater than the threshold limit, indicating the monitored sensor 14 is in a stuck in range state. It would be understood that a monitored sensor 14 which is sensing a steady state condition of the monitored member 12 would also exhibit a variation value of zero during the steady state condition, however in this instance, the correlated sensor 24 which is sensing a steady state condition of correlated member 22 correlated to the steady state condition sensed by the monitored sensor 14 would exhibit a correlated variation value similar to that of the monitored sensor 14, e.g., close to zero. In this instance, where the system 10 and/or both the sensed members 12 and 22 are in a steady state condition, the magnitude of difference between the monitored variation value and the correlated variation value would be close to zero, and therefore would be below the threshold value such that a stuck in range state would not be indicated for the monitored sensor 14.

The control module 20 shown in FIG. 1 includes a processor 30, a memory 32, and a timer module 40. The memory 32 can include, by way of example, Read Only Memory (ROM), Random Access Memory (RAM), electrically-erasable programmable read only memory (EEPROM), etc., of a size and speed sufficient for executing the method described herein and for storing data which may include, for example, signal values, signal deviations, variation values, fault indicators, algorithms, etc. as described herein. The timer module 40 includes a clock cycle, and a timer and/or other time tracking mechanism which may be used to establish a predetermined sampling rate, to associate a clock time with a sample such as a sample signal value or with an indicator such as a stuck in range indicator, to initiate and actuate a timer for a time period such as a diagnostic period, a sample time period, a diagnosis time, etc.

The system 10 further includes a signal deviation module 34, a variation determination module 36, and a sensor diagnostic module 38, each in operable communication with the control module 20. The signal deviation module 34 is configured to receive a signal from one or more sensors in the system 10, for example, from the monitored sensor 14 and/or from the correlated sensor 24, and to generate a sensor deviation value for that sensor based on the signal received from that sensor. The signal deviation module 34 is configured to perform sampling of the received signal, where in the present example the received signal is one of the monitored signal 16 and the correlated signal 26, to store sampled values of the received signal in the memory 32, and use one or more algorithms which may be included in the signal deviation module 34 to generate a signal deviation of the received signal using samples of a received signal taken at different times. The samples may be consecutive samples in a plurality of samples performed at a predetermined sampling rate. The predetermined sampling rate may be based on a clock cycle or sample time period generated by the timer module 40. Each sample of the received signal may be associated with the respective sample time of that sample and stored in the memory 32. The signal deviation module 34 may determine a difference between samples of the received signal performed at different sample times. The signal deviation module 34 may determine a signal deviation for each of the differences based on the magnitude of the difference between the samples performed at different sample times. The signal deviation module 34 may determine a plurality of signal deviations during a diagnostic period, including, for example, a first signal deviation based on signal samples performed at a first and a second sample time, a second signal deviation based on signal samples performed at a second and a third sample time, and so on. Each signal deviation may be stored in memory 32.

In a non-limiting example, as illustrated by the method shown in FIG. 3, the signal deviation module 34 receives the monitored signal 16 and the correlated signal 26, and performs synchronized sampling of the each of the monitored signal 16 and the correlated signal 26, such that a sample time for the monitored signal 16 is synchronized with a sample time for the correlated signal 26, and such that the synchronized samples of the monitored signal 16 and the correlated signal 26 represent an operating condition of the system 10 including the monitored member 12 and correlated member 22 then existing at that time. As shown in FIG. 3 at steps 206 and 210, at a first sample time established by the timer module 40, the signal deviation module 34 can perform a first synchronized sampling of each of the monitored signal 16 and the correlated signal 26, then at a second sample time established by the timer module 40, as shown in FIG. 3 at steps 214 and 220, the signal deviation module 34 can perform a second synchronized sampling of each of the monitored signal 16 and the correlated signal 26. The signal deviation module 34 may then determine a signal deviation for the monitored signal 16 based on the difference between the first and second samples of the monitored signal 16 performed respectively at first and second monitored sample times, and may determine a signal deviation for the correlated signal 26 based on the difference between the first and second samples of the correlated signal 26 performed respectively at first and second correlated sample times. As previously described herein, the first synchronized sampling includes the first monitored sample time and the first correlated sample time, which are synchronized to each other, and the second synchronized sampling includes the second monitored sample time and the second correlated sample time, which are synchronized to each other. In other example, during the first synchronized sampling, the first monitored sample and the first correlated sample may be performed simultaneously such that the first monitored sample time and the first correlated sample time are the same time. Similarly, during the second synchronized sampling, the second monitored sample and the second correlated sample may be performed simultaneously such that the second monitored sample time and the second correlated sample time are the same time.

In another example, the signal deviation module 34 may determine a signal deviation for the monitored signal 16 based on the magnitude of the difference between the first and second samples of the monitored signal 16, and may determine a signal deviation for the correlated signal 26 based on the magnitude of the difference between the first and second samples of the correlated signal 26. The method may return from step 226 to step 212 such that the signal deviation module 34 may continue synchronized sampling of each of the monitored signal 16 and the correlated signal 26, at a sampling frequency or sample time determined by the timer module 40, and to continue to generate a plurality of signal deviations for each of the monitored signal 16 and the correlated signal 26 based on determining the difference or a magnitude of the difference between signal samples taken at different sample times over a sample period until either a predetermined number of samples is performed or a predetermined sample time period has elapsed, at which point the method continues to step 228. For example, the signal deviation module 34 may determine a second monitored signal deviation based on difference between a sample of the monitored signal 16 taken at a third monitored sample time, and the sample of the monitored signal 16 taken at the second monitored sample time, and may determine a second correlated signal deviation based on difference between a sample of the correlated signal 26 taken at a third correlated sample time, and the sample of the correlated signal 26 taken at the second correlated sample time, and so on for subsequent samples taken at subsequent sample times, such that the signal deviation module 34 may generate a plurality of signal deviations for each of the monitored signal 16 and correlated signal 26, each respective signal deviation corresponding to the respective sample time period including the respective synchronized sample times of the signal samples used to generate the respective sample deviation. The plurality of signal deviations may be stored in memory 32 and used by the variation determination module 36 to generate a plurality of variation values as described in further detail herein.

The variation determination module 36 is configured to and/or includes one or more algorithms to generate a signal variation value for a received signal, which may be, for example, one of the monitored signal 16 and the correlated signal 26, based on a plurality of signal deviations of the received signal. In one example, the signal variation value of the received signal may be a sum of the plurality of signal deviations of the received value. In another example, the signal variation value of the received signal may be an average of the plurality of signal deviations of the received signal. A first signal variation value may be generated for a received signal for a first diagnostic period, based on signal deviations generated during the first diagnostic period, for example, as shown in steps 202 through 228 of FIG. 3. Steps 202 through 228 may be repeated to generate a second signal variation value for the received signal for a second diagnostic period, based on signal deviations generated during the second diagnostic period. Steps 202 through 228 may be repeated in a looping fashion such that the variation determination module 36 may generate a plurality of signal variation values, each respective signal variation value corresponding to a respective diagnostic period. The variation values generated by the variation determination module 36 may be stored in the memory 32.

At the initiation of a diagnostic period, represented in FIG. 3 by steps 202 through 228, the variation value of each of the monitored signal 16 and correlated signal 26 may be initially set to a value of zero, shown at steps 204, 208 respectively. After the first and the second samples are made of the monitored signal 16 and the correlated signal 26 at steps 206 and 210, respectively, a first signal deviation may be determined for each respective signal 16, 26 based on the magnitude of the difference between the respective first and second samples of each respective signal 16, 26 at steps 216 and 222 respectively. Subsequent signal deviations may be determined for each respective signal 16, 26 as the method represented in FIG. 3 loops repeatedly through steps 212 through 226, such that the variation value of each respective signal 16, 26 may be increased by each respective signal deviation generated during the diagnostic period and stored in memory 32. For example, after a third sample of the monitored signal 16 and the correlated signal 26 is performed when steps 214 and 220 are repeated, a second signal deviation value may be determined for each respective signal 16, 26 based on the magnitude of the difference between the respective second and the third samples of each respective signal 16, 26. The variation value of each respective signal 16, 26 may be increased again by the respective second signal deviation and stored in the memory 32.

In one example, the variation value of each respective signal 16, 26 may continue to be increased until a predetermined number of samples have been performed, thus completing a diagnostic period. When the number of samples is greater than the predetermined number of samples, the diagnostic period is reinitialized, for example, by resetting the number of samples to zero, and resetting the variation value to a value of zero prior to repeating the sample sequence for a subsequent diagnostic period.

In another example, the variation value may continue to be increased until a predetermined diagnosis time has elapsed. The timer module 40 may initialize a timer that increments based on the clock cycle. When the timer value is greater than or equal to the predetermined diagnosis time, the diagnostic period is reinitialized, for example, by resetting the variation value to a value of zero prior to repeating the sample sequence for the predetermined diagnosis time during a subsequent diagnostic period.

In another example, the variation value may be based on a predetermined total number of signal deviations. For example only, the variation value may be a rolling sum and/or average of the predetermined total number of signal deviations such as X. When an X+1 signal deviation is determined, the first signal deviation of the rolling sum may be removed from the variation value determination, such that on a rolling basis, the variation value determination is based on X number of signal deviations.

The sensor diagnostic module 38 is configured to store and/or define a fault threshold, to determine a state of a sensor, such as a stuck in range state of a monitored sensor 14, to compare a fault threshold to a parameter defined by the monitored and correlated signals 16, 26, etc. For example, in the method shown in FIG. 3, the sensor diagnostic module 38 at step 228 compares the difference between the variation values of the monitored signal 16 and the correlated signal 26 to a fault threshold, to determine whether the monitored signal 16 is stuck in range. In another example, the magnitude of the difference between the variation values of the monitored signal 16 and the correlated signal 26 is compared to a fault threshold, and where the magnitude of the difference is equal to or greater than the fault threshold, the sensor diagnostic module 38 generates a fault indicator to indicate the monitored sensor 14 is stuck in range. In one example, the fault threshold may be a calibrated value which may be generated by a calibration performed by one of the control module 20 and sensor diagnostic module 38.

The examples provided herein are non-limiting, and it would be understood that other configurations of modules may be used in the system 10. For example, one or more of the control module 20, the signal deviation module 34, a variation determination module 36, and a sensor diagnostic module 38 may be configured to perform the functions of one or more of another of the control module 20, the signal deviation module 34, a variation determination module 36, and a sensor diagnostic module 38, etc. One or more of the sensors 14, 24 and the sensed members 12, 22 may be in operative communication with the control module 20 and/or one or more of the other modules 34, 36, 38.

Referring now to FIGS. 1 and 2, by way of non-limiting example, the system 10 of FIG. 1 and method described herein may be adapted for use to detect a stuck in range state of a sensor in a powertrain system 100 as shown in FIG. 2. The powertrain system 100 includes a power inverter module 112 operatively connected to a motor-generator 118 and to an energy storage device 122. The power inverter module 112, the motor-generator 118, and the energy storage device 122 are in electrical communication with the control module 120 and with each other. In a non-limiting example, the powertrain system 100 may be a powertrain for a vehicle (not shown), which may be an automotive or non-automotive vehicle. The vehicle may be a non-hybrid vehicle or a hybrid vehicle, such as an electric hybrid vehicle. The control module 120 may be a vehicle control module, such as a powertrain control module.

The motor-generator 118 can selectively function as a motor powered by energy provided by the energy storage device 122, or as a generator to generate alternating current (AC) energy to be stored in the energy storage device 122. The energy storage device 122, also referred to herein as a battery, may be a direct current (DC) battery, a multi-cell energy storage device, or other suitable storage device for storing electrical energy generated by the motor-generator 118 when the motor-generator 118 functions as a generator, and for providing energy to the motor-generator 118 when the motor-generator 118 functions as a motor. The power inverter module 112, also referred to herein as an inverter 112, can convert direct current (DC) provided by the battery 122 to alternating current (AC) to power the motor-generator 118 to function as a motor, and can convert alternating current (AC) generated by the motor-generator functioning as a generator to direct current (DC) for storage in the battery 112.

The powertrain system 100 further includes an inverter voltage sensor 114 and a battery voltage sensor 124. The inverter voltage sensor and battery voltage sensors 114, 124 are in operative communication with the control module 120. In the example shown, the inverter voltage sensor 114 is configured to sense an input voltage of the inverter 112, and to output an inverter voltage sensor signal 116 to the control module 120. In the example shown, the battery voltage sensor 124 is configured to sense a voltage of the battery 122, and to output a battery voltage sensor signal 126 to the control module 120. The system 100 and/or the inverter 112 and the battery 122 are arranged such that the inverter voltage sensor signal 116 and the battery voltage sensor signal 126 are correlated to each other, and such that there exists a known relationship between the inverter voltage sensor signal 116 and the battery voltage sensor signal 126 during operation of the powertrain system 100. For simplicity of illustration, in an exemplary description of the method, like numerals in FIG. 2 correspond to like elements in FIG. 1, for example, the system 10 corresponds to the powertrain system 100, such that the inverter voltage sensor 114 corresponds to the monitored sensor 14, the inverter voltage sensor signal corresponds to the monitored sensor signal 16, and the inverter 112 corresponds to the monitored member 12. Further, battery voltage sensor corresponds 124 to the correlated sensor 24, the battery voltage sensor signal 126 corresponds to the correlated sensor signal 26, and the battery 122 corresponds to the correlated member 22. As such, the exemplary system and method will be described to detect a stuck in range condition of the inverter voltage sensor 114 corresponding to the monitored sensor 14, using the inverter voltage sensor signal 116 corresponding to the monitored signal 16, and the battery voltage sensor signal 126 corresponding to the correlated signal 26.

The powertrain system 100 shown in FIG. 2 includes a processor 130, a memory 132, and a timer module 140, each respectively configured as previously described for the respective processor 30, memory 32 and timer module 40 of FIG. 1. The powertrain system 100 further includes a signal deviation module 134, a variation determination module 136, and a sensor diagnostic module 138, each in operable communication with the control module 120, and each respectively configured as previously described for the respective modules 34, 36, 38 and 20 of FIG. 1.

Referring now to FIG. 3, a high-level diagram of a method to diagnose a sensor which is stuck in range is illustrated. The method may begin with a start or initialization step indicated at 200, at which time the method begins monitoring operating conditions of the system 10, 100 including the monitored sensor 14, 114 and the correlated sensor 24, 124. Initialization of the method at step 200 may concurrent with initiating operation of the system 10, 100. For example, and referring to the powertrain system 100 shown in FIG. 2, initiating operation of the powertrain system 100 by starting a vehicle including the powertrain system 100 may initialize the method beginning with step 200 shown in FIG. 3. In another example, step 200 may be initialized in response to specific conditions being met by the system 10, 100, such as detection of a signal output from one or both of the monitored sensor 14, 114 and the correlated sensor 24, 124. Alternatively, the method 100 may run constantly and/or loop continuously whenever the system 10, 100 is in use.

At step 202 a predetermined diagnostic period is initiated, which may include initializing a timer of the timer module 40, 140 to zero, for example, where the diagnostic period is defined by a diagnosis time, and/or resetting a sample counter in the controller 20, for example, where the predetermined diagnostic period is defined by a predetermined number of samples. At step 204, a monitored signal variation value of the monitored sensor 14, 114 is initialized to a value of zero. Similarly, at step 208, a correlated signal variation value of the correlated sensor 24, 124 is initialized to a value of zero. At step 206, which is synchronized with step 210 to perform a first synchronized sampling during the diagnostic period, the signal deviation module 34, 134 performs a first sample of the monitored signal 16, 116 at a first monitored sample time, and stores the sample in memory 32, 132. At step 210, which is synchronized with step 206, the signal deviation module 34, 134 performs a first sample of the correlated signal 26, 126 at a first correlated sample time and stores the sample in memory 32, 132.

At step 212 the timer is incremented, for example, by the timer module 40 to a second sample time and the method proceeds to steps 214 and 220, to perform a second synchronized sampling of the monitored signal 16, 116 and correlated signal 26, 126. At step 214, the signal deviation module 34, 134 performs a second sample of the monitored signal 16, 116 at a second monitored sample time during the diagnostic period, where the second monitored sample time and the first monitored sample time are different times. At step 220, at a second correlated sample time and synchronized with step 214, the signal deviation module 34, 134 performs a second sample of the correlated signal 26, 126, where the second correlated sample time and the first correlated sample times are different times.

At steps 216 and 222, the signal deviation module 34, 134 generates a first signal deviation value for each of the monitored signal 16, 116 and the correlated signal 26, 126. The signal deviation module 34, 134 at step 216 generates the first signal deviation value for the monitored signal 16,116, for example, by determining the magnitude of the difference between the first sample of the monitored signal 16, 116 taken at step 206 and the second sample of the monitored signal 16, 116 taken at step 214. The signal deviation module 34, 134 at step 222 generates the first signal deviation value for the correlated signal 26,126, for example, by determining the magnitude of the difference between the first sample of the correlated signal 26, 126 taken at step 208 and the second sample of the correlated signal 26, 126 taken at step 220.

At steps 218 and 224, the variation determination module 36, 136 determines a variation value for each of the monitored signal 16, 116 and the correlated signal 26, 126, and may store the respective variation values of the monitored signal 16, 116 and the correlated signal 26, 126 in memory 32, 132.

The method proceeds to step 226, to determine whether the diagnostic period is complete. For example, where the diagnostic period is defined by a predetermined diagnosis time, at step 226 the control module 20, 120 and/or the timer module 40, 140 determines if the timer value has reached the diagnosis time. If the timer value meets or exceeds the predetermined diagnosis time, the method proceeds to step 228. If the timer value is less than the predetermined diagnosis time, the method returns to step 212 and the timer is incremented at step 212 to a third sample time, and the method proceeds to steps 214 and 220, to perform a third synchronized sampling of the monitored signal 16, 116 and the correlated signal 26, 126. Alternatively, where the diagnostic period is defined by a predetermined number of samples, at step 226 the control module 20, 120 and/or the signal deviation module 34, 134 determined if the number of samples performed has met a predetermined number of samples required for the diagnostic period. If the number of samples performed meets the predetermined number of samples required for the diagnostic period, the method proceeds to step 228. If the number of samples performed is less than the predetermined number of samples, the method loops back, e.g., returns to step 212, where the number of steps performed is incremented and/or the timer is incremented to a third sample time, and the method proceeds to steps 214 and 220 to perform a third synchronized sampling of the monitored signal 16, 116 and the correlated signal 26, 126.

At step 214, the signal deviation module 34, 134 performs a third sample of the monitored signal 16, 116 at the third monitored sample time. At step 220, at a third correlated sample time and synchronized with step 214, the signal deviation module 34, 134 performs a third sample of the correlated signal 26, 126. The third sample time, the second sample time, and the first sample time are different times. The first, second, and third sample times may be consecutive times.

At steps 216 and 222, the signal deviation module 34, 134 generates a second signal deviation value for each of the monitored signal 16, 116 and the correlated signal 26, 126. The signal deviation module 34, 134 at step 216 generates the second signal deviation value for the monitored signal 16,116, for example, by determining the magnitude of the difference between the third sample of the monitored signal 16, 116 taken at step 214 and the second sample of the monitored signal 16, 116 previously taken at step 214. The signal deviation module 34, 134 at step 222 generates the second signal deviation value for the correlated signal 26,126, for example, by determining the magnitude of the difference between the third sample of the correlated signal 26, 126 taken at step 220 and the second sample of the correlated signal 26, 126 taken at step 220.

At steps 218 and 224, the variation determination module 36 regenerates the respective variation value for each of the monitored signal 16, 116 and the correlated signal 26, 126 based on the respective first and second signal deviations of each of the monitored signal 16, 116 and the correlated signal 26, 116, and may store the respective variation values in memory 32. In one example, the variation value for each respective one of the monitored signal 16, 116 and the correlated signal 26, 126 is determined by a sum of the signal deviation values of the respective one of the monitored signal 16, 116 and the correlated signal 26, 126 generated during the diagnostic period. In another example, the variation value for each respective one of the monitored signal 16, 116 and the correlated signal 26, 126 is determined by an average of the signal deviation values of the respective one of the monitored signal 16, 116 and the correlated signal 26, 126 generated during the diagnostic period.

The method again proceeds to step 226, to again determine whether the diagnostic period is complete, for example, by determining if the timer value initialized at step 202 has reached the diagnosis time, and/or if the number of samples performed has reached the predetermined number of samples required by the diagnostic period. If the diagnosis time and/or number of samples performed have not met the requirement to complete the diagnostic period, the method returns to step 212 and repeats as previously described. If the diagnosis time and/or number of samples performed have met the requirement to complete the diagnostic period, the method proceeds to step 228.

At step 228, the state of the monitored sensor 14, 114 at the completion of the diagnostic period is determined based on a comparison of the monitored sensor variation value and the correlated sensor variation value determined during the diagnostic period. The sensor diagnostic module 38 determines a magnitude of difference between the monitored sensor variation value and the correlated sensor variation value, and compares the magnitude of difference to a predetermined fault threshold to determine whether the monitored sensor 14, 114 is stuck in range. When the magnitude of the difference between the monitored and correlated sensor variation values is less than the fault threshold, there is no indication of that the monitored sensor 14, 114 is in a stuck in range state, and the method returns to step 202, and a subsequent diagnostic period is initiated to continue monitoring the monitored sensor 14, 114. When the magnitude of the difference between the monitored and correlated sensor variation values is equal to or greater than the fault threshold, the monitored sensor 14, 114 is diagnosed as stuck in range, e.g., is diagnosed as being in a stuck in range state, and the method proceeds to step 230, where the sensor diagnostic module 38 generates an indicator to indicate the monitored sensor 14, 114 is in the stuck in range state. The method then returns to step 202, as shown in FIG. 3, and a subsequent diagnostic period is initiated to continue monitoring the monitored sensor 14, 114.

It would be understood that modifications and variations of the present invention are possible in light of the above teachings and may be practiced otherwise than as specifically described while within the scope of the appended claims. In addition, the reference numerals in the claims are merely for convenience and are not to be read in any way as limiting. For example, the monitored member 112 and the monitored sensor 114 may be in a different system of the vehicle (not shown) than the system of the vehicle including the correlated member 122 and the correlated sensor 124. By way of non-limiting example, the monitored member 112 and the monitored sensor 114 may be in the powertrain system 100 of a vehicle, and the correlated member 122 and the correlated sensor 124 may be in a non-powertrain system (not shown) of the vehicle, where the powertrain system 100 includes the controller 120 and the non-powertrain system includes a second controller (not shown) which is in communication with the controller 120 such each of the monitored signal 116 and the correlated signal 126 are transmitted to different controllers in communication with each other, and such that the correlated signal 126 is transmitted via the second controller to the controller 120 for use in detecting a stuck in range condition of the monitored sensor 114. In another example, a plurality of correlated signals 26, 126 from a plurality of correlated sensors 24, 124 may be combined, for example, by a predetermined algorithm based on a known relationship between the various correlated signals and the monitored signal to provide a correlated variation value defined by the plurality of correlated signals for comparison with the monitored variation value, to determine a stuck in range condition of the monitored sensor 14, 114.

The detailed description and the drawings or figures are supportive and descriptive of the invention, but the scope of the invention is defined solely by the claims. While some of the best modes and other embodiments for carrying out the claimed invention have been described in detail, various alternative designs and embodiments exist for practicing the invention defined in the appended claims.

The invention claimed is:

1. A method of diagnosing a stuck in range sensor, the method comprising:
receiving a monitored signal from a monitored sensor;
receiving a correlated signal from a correlated sensor;
wherein the correlated signal is correlated to the monitored signal;
determining a variation value of the monitored signal;
determining a variation value of the correlated signal; and
determining a state of the monitored sensor based on a magnitude of a difference between the variation value of the monitored signal and the variation value of the correlated signal.

2. The method of claim 1, wherein the difference in magnitude between the variation value of the monitored signal and the variation value of the correlated signal is determined over a diagnostic period which is the same diagnostic period for:
determining the variation value of the monitored signal; and
determining the variation value of the correlated signal.

3. The method of claim 1, wherein:
determining the variation value of the monitored signal further comprises:
determining a first monitored signal deviation and a second monitored signal deviation; and
determining the variation value of the correlated signal further comprises:
determining a first correlated signal deviation and a second correlated signal deviation.

4. The method of claim 3, wherein:
the variation value of the monitored signal is defined by a sum of the first and the second monitored signal deviations; and
the variation value of the correlated signal is defined by a sum of the first and the second correlated signal deviations.

5. The method of claim 3, wherein:
the variation value of the monitored signal is defined by an average of the first and the second monitored signal deviations; and the variation value of the correlated signal is defined by an average of the first and the second correlated signal deviations.

6. The method of claim 3, wherein:
the first monitored signal deviation is determined over a first monitored sample time period;
the first correlated signal deviation is determined over a first correlated sample time period;
wherein the first monitored sample time period and the first correlated sample time period are synchronized;
the second monitored signal deviation is determined over a second monitored sample time period;
the second correlated signal deviation is determined over a second correlated sample time period; and
wherein the second monitored sample time period and the second correlated sample time period are synchronized.

7. The method of claim 6, wherein:
the first monitored sample time period and the first correlated sample time period are the same time period; and
the second monitored sample time period and the second correlated sample time period are the same time period.

8. The method of claim 3, wherein:
the first monitored signal deviation is based on a magnitude of a difference between a first monitored signal value sampled at a first monitored sample time and a second monitored signal value sampled at a second monitored sample time, wherein the second monitored sample time is different than the first monitored sample time;
the second monitored signal deviation is based on a magnitude of a difference between the second monitored signal value and a third monitored signal value sampled at a third monitored sample time;
the third monitored sample time is different than the second monitored sample time;
the first correlated signal deviation is based on a magnitude of a difference between a first correlated signal value sampled at a first correlated sample time and a second correlated signal value sampled at a second correlated sample time; and
the second correlated signal deviation is based on a magnitude of a difference between the second correlated signal value and a third correlated signal value sampled at a third correlated sample time;
wherein the first, second and third correlated sample times are different times.

9. The method of claim 1, further comprising:
determining a stuck in range state when the magnitude of the difference between the variation value of the monitored signal value and the variation value of the correlated signal value is greater than or equal to a fault threshold.

10. The method of claim 1, further comprising:
diagnosing a stuck in range sensor of a vehicle, the vehicle comprising:
a control module including a variation determination module that generates the variation values of each of the monitored sensor and the correlated sensor;
the monitored sensor sensing a first condition of the vehicle;
the correlated sensor sensing a second condition of the vehicle; and
wherein the first condition and the second condition are different conditions of the vehicle.

11. The method of claim 1, further comprising:
the monitored sensor sensing one of:

an inverter input voltage of an inverter; and
a battery voltage of a battery;
wherein the inverter is operatively connected to the battery such that the inverter input voltage and the battery voltage are correlated to each other during operation of the inverter and the battery; and
the correlated sensor sensing the other of the inverter input voltage and the battery voltage.

* * * * *